United States Patent [19]
Waugh et al.

[11] Patent Number: 5,060,298
[45] Date of Patent: Oct. 22, 1991

[54] MONOLITHIC DOUBLE BALANCED MIXER WITH HIGH THIRD ORDER INTERCEPT POINT EMPLOYING AN ACTIVE DISTRIBUTED BALUN

[75] Inventors: Raymond M. Waugh, Phillipsburg; Mahesh Kumar, Lawrenceville, both of N.J.

[73] Assignee: Siemens Aktiengesellschaft, Berlin and Munich, Fed. Rep. of Germany

[21] Appl. No.: 282,542

[22] Filed: Dec. 9, 1988

[51] Int. Cl.$^5$ .............................................. H04B 1/26
[52] U.S. Cl. .................................... 455/326; 455/333; 330/54; 330/277
[58] Field of Search ................. 455/326, 333; 333/25, 333/26, 100, 138; 330/54, 277; 307/529; 328/65

[56] References Cited

U.S. PATENT DOCUMENTS

| | | | |
|---|---|---|---|
| 4,619,001 | 10/1986 | Kane | 455/326 |
| 4,637,069 | 1/1987 | Charbonnier | 455/326 |
| 4,668,920 | 4/1987 | Jones | 330/277 |
| 4,675,911 | 6/1987 | Sokolov et al. | 330/54 |
| 4,712,024 | 12/1987 | McGuire et al. | 455/189 |
| 4,737,739 | 4/1988 | Rosier et al. | 331/138 |

OTHER PUBLICATIONS

Siliconix Application Note, No. AN85-2, Oct. 1986, by Oxner, "A Commutation Double Balanced MOSFET Mixer of High Dynamic Range".
"A Monolithic Single-Chip X-Band Four-Bit Phase Shifter", by Ayasly et al., IEEE Trans. on Microwave Theory and Techniques, vol. MTT-30, No. 12, Dec. 1982, pp. 2201-2206.
"Monolithic Dual-Gate GaAs FET Digital Phase Shifter", by Vorhaus et al., IEEE Trans. on Microwave Theory and Techniques, vol. MTT-30, No. 7, Jul. 1982, pp. 982-992.
"Microwave Semiconductor Circuit Design, Chapter 13-Circuits Using PIN Diodes", by W. Allen Davis, Van Nostrand Reinhold Company, Inc. (1984), pp. 264-293.
"2 to 8 GHz Double Balanced MESFET Mixer with + DBM Input 3rd Order Intercept", by S. Weiner et al., *1988 IEEE MTT-S Digest*, pp. 1097-1100.
IEEE Trans. on Micro. Theory & Tech., vol. MTT-35, No. 4, Apr. '87, by Crété et al., pp. 435-440.
Microwave Jour., May 1988, by Bierig et al., pp. 251-270.
Microwave Jour., May 1988, by D. Fisher, pp. 275-292.
1988 IEEE MTT-S Digest, by Weiner et al., pp. 1097-1099.
1988 IEEE MTT-S Digest, by S. A. Maas, pp. 895-898.

*Primary Examiner*—Reinhard J. Eisenzopf
*Assistant Examiner*—Lisa Charouel

[57] ABSTRACT

A monolithic double balanced mixer with a high third order intercept point employs a local oscillator signal which is applied to the input port of a first active distributed element balun. The balun has two outputs which are applied via amplifiers to respective inputs of a double balanced resistive FET quad mixer. The double balanced resistive FET quad mixer employs four MESFETs arranged in a ring configuration. Two additional inputs to the quad mixer are obtained from a second balun which is also of an active distributed element configuration and receives at the input the RF signal. The quad mixer operates to produce mixing of the LO and RF signals at the outputs thereof. The outputs of the quad mixer are applied to a combiner which operates to combine the outputs of the quad mixer to produce at the combiner output an IF signal. The combiner can be a common gate combiner configuration with active loads or a distributed configuration employing FET devices in a distributed transmission line type of circuit.

8 Claims, 4 Drawing Sheets

MONOLITHIC DOUBLE BALANCED MIXER WITH HIGH THIRD ORDER INTERCEPT POINT EMPLOYING AN ACTIVE DISTRIBUTED BALUN

RELATED APPLICATIONS

See an application entitled MONOLITHIC DOUBLE BALANCED MIXER WITH HIGH THIRD ORDER INTERCEPT POINT EMPLOYING A LUMPED ELEMENT BALUN, filed on even date herewith for R. Waugh et al, the inventors herein and assigned to the assignee herein.

BACKGROUND OF THE INVENTION

This invention relates to mixers in general and more particularly to a monolithic double balanced mixer having a high third order intercept point and employing an active distributed element balun.

Mixers are widely employed in the microwave art and many examples of suitable mixing circuits exist. A microwave mixer converts an RF signal to an intermediate frequency (IF) signal somewhere between the RF and a local oscillator (LO) signal. The IF signal is usually chosen to fall in the range of 20 to 100 mHz. This frequency is low enough to build high quality IF amplifiers relatively inexpensively and yet high enough to avoid the flicker noise that is inversely proportional to frequency. The IF frequency is obtained by injecting in addition to the RF signal a local oscillator (LO) or a pump frequency ($\omega_l$).

The difference or IF frequency is a result of the mixers non-linearity. For example, certain mixers employ diodes. Hence, the diode produces the sum and difference frequencies of the two input signals when the two input signals are multiplied together. This operation of nonlinear devices in mixer circuits is well known.

As is also well known, mixer designs generally fall into three catagories: single ended, balanced, and double balanced. The double balanced mixers are capable of isolating both the signal (RF) and the local oscillator (LO) voltages from the output. Hence, the term double balanced is used. Many configurations exist in the prior art and a very popular configuration is known as the "ring circuit" which employs four diodes where the diodes are pointed in the same direction.

Another prior art configuration is called a "star circuit" which employs two diodes pointing toward the central node and two diodes pointing away from the central node. During one half of the local oscillator cycle, half the diodes are in the high resistance state and half the diodes are in the low resistance state. During the other half of the local oscillator signal, the diodes are in the opposite state. Thus, the mixer can be considered as a symmetrical switch turning on and off at the local oscillator frequency. On the average, the signal voltage at the output is zero.

For examples of prior art mixing circuits, reference is made to a text entitled *Microwave Semiconductor Circuit Design* by W. Alan Davis, published by Van Nostrand Rheinhold Co., 1984. Reference is made to Chapter 12 entitled "Schottky-Barrier Diode Application" pages 253-263 entitled "Mixers".

As is known in the prior art, the third order intermodulation performance of a down converter is usually limited by the performance of the mixer. Traditional diode mixers as indicated above require large LO signal levels to obtain a high IP3 which is not practical in many systems, especially in monolithic microwave integrated circuits (MMIC). It is known that a double balanced mixer will have superior IP3 performance over a signal ended or single balanced mixers. Commonly, diodes have been used as mixing elements and more recently active FETS. Neither of these will give an IP3 greater than +30 dBm even when employing a double balanced mixer configuration with low conversion loss.

The prior art has widely investigated such mixing circuits. Reference is made to an article entitled "A GaAs MESFET Balanced Mixer With Very Low Intermodulation" by Stephen A. Maas, published in the 1987 *IEEE MTT-S Digest*, pages 895-898. This article describes a balanced resistive mixer which was fabricated using the unbiased channel of a GaAs MESFET as the mixing element. Because the resistance is only very weakly non-linear, very low intermodulation results. The state of the art second and third order output intercept points of 34 and 21 dBm were achieved with a 7 dB conversion loss at X-band frequencies. The circuit employed an LO balun which was coupled to the gate electrodes of two FET devices where the output electrodes of the FET devices were coupled to an IF filter and transformer all of which were employed utilizing monolithic microwave integrated circuit (MMIC) techniques.

Reference is also made to an article entitled "Performance of Arrays of SIS Junctions in Hetrodyne Mixers" by Denis-Gerard Crete, et al. published in the *IEEE Transactions on Microwave Theory and Techniques*, Vol. MTT-35 No. 4, April 1987, pages 435-440. This article describes milimeter wave hetrodyne mixers which employ arrays of SIS tunnel junctions. The SIS tunnel junction was demonstrated as being an extremely sensitive mixing element for milimeter wave receivers. The article thus describes such junctions as employed in mixer configurations.

For a general background in regard to the use of GaAs IC's as employed for implementing radio receivers and utilizing MMIC approaches, reference is made to an article entitled "GaAs IC Applications in Electronic Warfare, Radar and Communication Systems" by D. G. Fischer, published in the *Microwave Journal*, May 1988, pages 275-292. On page 280 of this article there is shown a quadrature IF down converter employing a mixer.

See also an article entitled "BroadBand MMIC's for System Applications" by Robert W. Bierig, et al. published in the *Microwave Journal*, May 1988, pages 261-270. This article also describes MMIC technology as well as components utilized with such technology. The article describes the implementation of mixers for microwave applications on page 268. Essentially, implementation of the broadband frequency converter function in MMIC form as indicated in the article represents a significant challenge. The article indicates that one approach that shows promise uses dual gate FETS in a distributed circuit topology. A distributed mixer employs the input capacitance of FET gates and a high impedance series transmission line section of impedance. Several dual gate FETS are cascaded to form a broad band structure for both the LO and RF mixer ports. A schematic diagram of the mixers is shown in FIG. 12A of the article. It is indicted that the circuit shown has been fabricated as an MMIC with the IF matching element consisting of a single gain stage amplifier.

Reference is also made to an article entitled "2 to 8 GHZ Double Balanced MESFET Mixer with +30 dBm Input Third Order Intercept" by S. Weiner, et al. published in the 1988 *IEEE MTT-S Digest*, pages 1097-1099. This article shows mixers which have a typical third order input intercept (IP3) of +30 dBm which was achieved from 2 to 8 GHZ utilizing a double balanced MESFET mixer operating in the unbiased or passive mode with +23 dBm LO input power.

A quality factor was defined in the article to show the efficiency of third order intercept to available LO power. Also a single balanced MESFET mixer from 4 to 18 GHZ with IP3 greater than +25 dBm was also described in the article.

As indicated, while diode mixers have been used as mixing elements as well as active FETS, neither of these will give an IP3 of greater than +30 dBm in a double balance mixer configuration without substantial loss.

It is, therefore, an object of the present invention to provide an improved double balanced mixer with high third order intercept point utilizing MMIC techniques.

It is a further object to provide an improved double balanced mixer employing GaAs MESFETS and using an active distributed balun.

SUMMARY OF THE INVENTION

A double balanced mixer apparatus for mixing an RF input signal with a local oscillator (LO) signal to provide at an output an intermediate frequency (IF) signal with a high third order intercept point, comprising a first active distributed input balun means having an input port for receiving said local oscillator signal (LO) and having first and second output ports, a double balanced resistive FET quad mixing means having first and second input ports for receiving said local oscillator signal, with said first input port coupled to said first output port of said first input balun, and said second input port coupled to said second output port of said first input balun, said mixing means having a third and a fourth input port for receiving said RF signal, and a first and second output port for providing an IF signal, a second active distributed input balun means having an input port for receiving said RF signal and having first and second output ports, with the first output port coupled to said third input port of said mixing means and said second output port coupled to said fourth input port of said mixing means, a combiner means having a first input port coupled to said first output port of said mixing means and a second input port coupled to said second output port of said mixing means to provide at an output of said combiner, said intermediate frequency signal (IF) relatively free of said LO and RF frequencies and having a high third order intercept point.

DETAILED DESCRIPTION OF THE FIGURES

Figure 1:
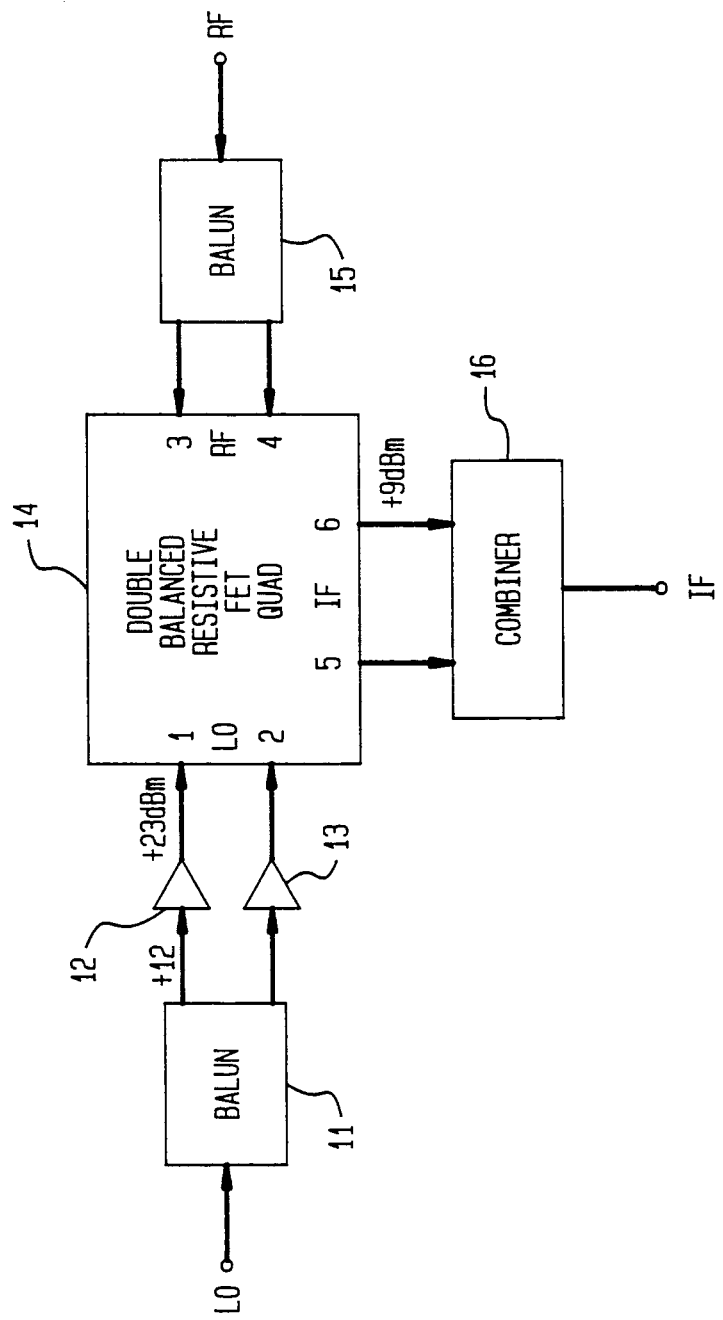
FIG. 1 is a schematic diagram of a double balanced mixer according to this invention.

Referring to FIG. 1, there is shown a block diagram of a double balanced mixer according to this invention.

As seen in FIG. 1, the local oscillator signal (LO) is applied to the input of a balun 11. The balun has two outputs. One output is applied to the input of a amplifier 12 while the other output is applied to the input of amplifier 13. The outputs of amplifiers 12 and 13 are directed to input ports of a double balanced resistive FET quad mixer circuit 14. As seen, input ports designated as 1 and 2 receive the LO frequency from amplifiers 12 and 13. The RF frequency is applied to the input of another balun 15. The two outputs from the balun 15 are applied to input ports 3 and 4 designated as RF. The quad mixer 14 operates to combine the LO and RF signals to provide at the output a signal containing the IF frequency. This IF signal appears at output ports 5 and 6 and is applied to the inputs of a combiner circuit 16. The function of the combiner circuit 16 is to combine the signals from the FET quad 14 to produce at the output the desired IF signal. The amplifiers 12 and 13 are typical FET amplifiers having, for example, a 11 dB gain at a frequency range between 6-12.5 GHZ. Additional amplifiers (not shown) may be included to amplify both the RF and LO signals. There amplifiers may have a gain of 16 dB for the LO signal at a range between 6-12.5 GHZ, and a gain of 6 dB for the RF signal at a range 8-10 GHZ.

As one can readily ascertain from FIG. 1, the circuit requires two baluns at 11 and 15 which if implemented by traditional passive circuits would require a large chip area which would therefore render the circuit unusable for a practical monolithic integrated circuit. As will be explained, according to this invention, one employs an active distributed balun to avoid the large and complex baluns of the prior art. Typical prior art baluns enable broad band impedance transformation and interstage coupling where matching was achieved with a balun transformer. Such transformers employ transmission line transformers in which the turns are arranged physically to include the interwinding capacitance as a component of the characteristic impedance of a transmission line. With this technique bandwidths of hundreds of mHz can be achieved. Good coupling can be realized without resonances leading to the use of balun transformers, power dividers, balun couplers, hybrids and so on. Typically, the line takes the form of twisted wire pairs and local coaxial lines can also be used.

In some configurations the length of the line determines the upper cutoff frequency. The lower frequency limit is determined by the primary inductance. The larger the core permeability, the fewer the turns required for the given low frequency response. Ferrite toroids have been found to be satisfactory with widely varying core material characteristics. The decrease in permeability with increasing frequency is offset by the increasing reactance of the wire itself causing a wideband, flat frequency response.

As indicated, such baluns are not suitable for incorporation in monolithic microwave integrated circuits. Thus, in order to avoid such problems, the present invention employs an active distributed balun for baluns 11 and 15 of FIG. 1.

As indicated, traditional passive baluns are not practical for monolithic implementation because of their large size and require a three-dimensional layout.

Figure 2:
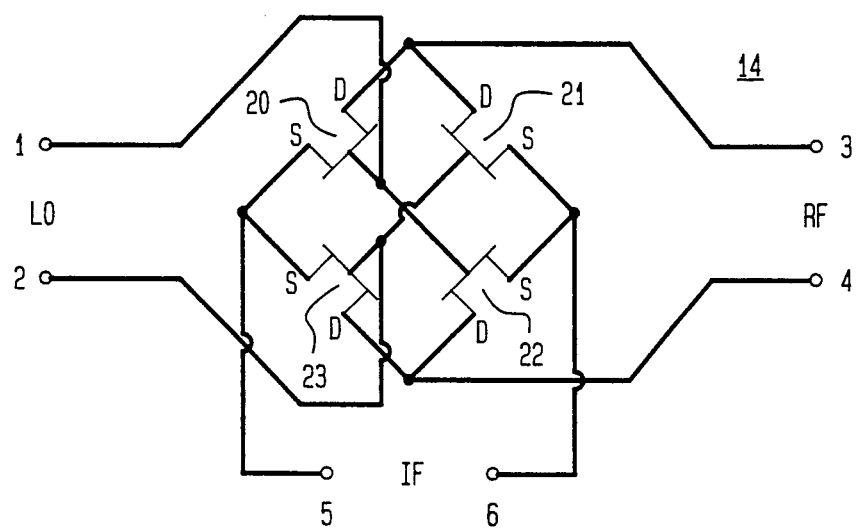
FIG. 2 is a schematic diagram of a double balanced resistive FET quad mixer utilized in this invention.

Referring to FIG. 2, there is shown a double balanced resistive FET quad mixer as mixer 14 of FIG. 1. As seen in FIG. 2, input ports 1 and 2 accommodate the local oscillator (LO) signal. This signal is applied to the gate electrodes of FETS 20 and 22 at input port 1 and applied to the gate electrodes of FETS 21 and 23 at input port 2. The FETS 20, 21, 22 and 23 are MESFETS or MOSFETS and structured employing GaAs technology.

As can be seen, the FETS are arranged in a ring type configuration. As indicated, each of the FETS is a GaAs device with no drain to source bias applied and are employed as mixing elements. The quad mixer exhibits an IP3 of better than +30 dBm. As seen in FIG. 2, FET 20 has its drain electrode connected to drain electrode of FET 21. The source electrode of FET 20 is connected to the source electrode of FET 23 with the drain electrode of FET 23 connected to the drain electrode of FET 22. The source electrode of FET 22 is connected to the source electrode of FET 21 to thus form a ring configuration. The gate electrodes of FETS 20 and 22 are connected together to form the input terminal 1 for the local oscillator. The other LO input terminal 2 is applied to the connected gate electrodes of FETS 21 and 23. The input terminals for the RF signal designated as 3 and 4 are taken between the drain electrodes of FETS 20 and 21 for RF input terminal 3 while RF input terminal 4 is connected to the drain electrodes of FETS 22 and 23. The IF output signal at terminals 5 and 6 is taken from the source electrodes of FETS 20 and 23 for output port 5 and between the source electrodes is FETS 21 and 22 for IF output port 6.

As indicated above, the most difficult specification in regard to a mixer is to meet the third order intercept point (IP3) which should be greater than +30 dBm. The limiting factor is in the device employed as a mixing element. The more linear the device, the lower the intermodulation products. The mixer shown in FIG. 2 preferably utilizes the channel resistance of unbiased MESFETS. This type of mixing element exhibits the lowest reported third order intercept as compared to other devices. Double balanced mixer configurations can achieve an IP3 of +30 dBm or greater and such a mixer can operate over the frequency range of LO and RF signals between 6 to 12.5 GHZ. The upper frequency limitation is mainly due to packaging and bonding parasitics.

Figure 3:
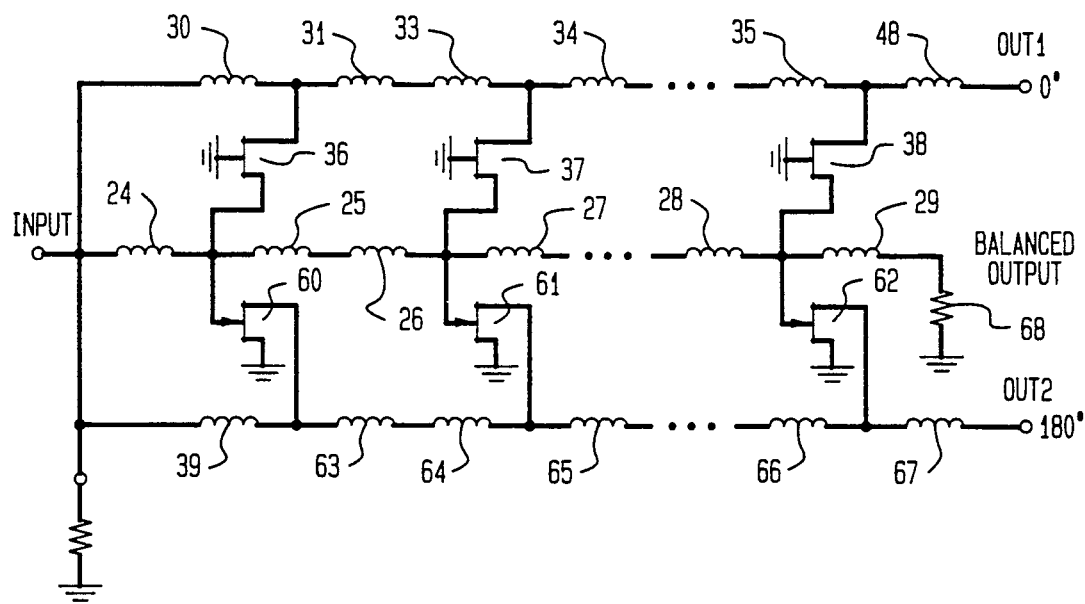
FIG. 3 is a schematic of an active distributed balun according to this invention.

Referring to FIG. 3, there is shown an active distributed balun using six FETS although more could be used if so desired. The use of common gate and common source techniques provides for a balanced signal at the outputs of the active distributed balun shown in FIG. 3. As seen in FIG. 3, the input signal is applied to essentially three parallel transmission lines. The input signal terminal is coupled to a first inductor 30 which is in series with an inductor 31. The inductor 31 is in series with an inductor 33 which is in series with an inductor 34 in series with an inductor 35 which is in series with an inductor 48.

This top input transmission line forms a first output designated as OUT 1 (0°). It is seen that the space between inductors 34 and 35 is indicated by a series of dotted lines which show that more stages can be employed. A second input transmission line comprises inductor 24 in series with inductor 25 in series with inductor 26 which is in series with inductor 27. Inductor 27 is in series with inductor 28; inductor 28 is in series with inductor 29 and is directed to ground via resistor 68 to form a second transmission line. A third transmission line consists of inductor 39 in series with inductor 63 which is in series with inductor 64 in series with inductor 65 which is in series with inductor 66 and inductor 67 to form a second output designated as OUT 2 (180°).

It is seen that the second and third transmission lines are broken at the same point as the first to indicate that more stages can be provided. As one will ascertain, there are six FETS shown in the Figure. The first FET 36 has its gate electrode grounded with its drain electrode connected to the junction between inductors 30 and 31 and with its source electrode connected to the junction between inductors 24 and 25.

A second FET 60 has its gate electrode coupled to the junction between inductors 24 and 25 and has a grounded source electrode with the drain electrode connected to the junction of inductors 39 and 63. In a similar manner, a third FET 37 has a grounded gate electrode with the drain electrode connected to the junction between inductors 33 and 34 and the source electrode connected between the junction of inductors 26 and 27.

A fourth FET 61 has a gate electrode connected to the junction of inductors 26 and 27 and has a grounded source electrode and has the drain electrode connected to the junction between inductors 64 and 65.

A fifth FET 38 has a grounded gate electrode and has the drain electrode connected between the junction of inductors 35 and 48 with the source electrode connected between the junctions of inductors 28 and 29.

A sixth FET 62 has the gate electrode connected between the junction of inductors 28 and 29 and has a grounded source electrode and has the drain electrode connected between the junction of inductors 66 and 67. As one can ascertain from FIG. 3, FETS 36, 37 and 38 are in a grounded gate configuration; while FETS 60, 61 and 62 are in a grounded source configuration. In this manner the use of common gate and common source techniques provides for a balanced signal at the outputs which are designated as 0° for the first output (OUT 1) and 180° for the second output (OUT 2).

The distributed balun as shown in FIG. 3 is process tolerant as it essentially is of a distributed amplifier configuration and utilizes distributed amplifier techniques for operation. As indicated above, the distributed circuit as shown in FIG. 3 is more process tolerant and because of its simulation of a transmission line can be designed to also perform as a low pass filter thus providing high rejection of any local oscillator leakage appearing at the IF output port.

Figure 4:
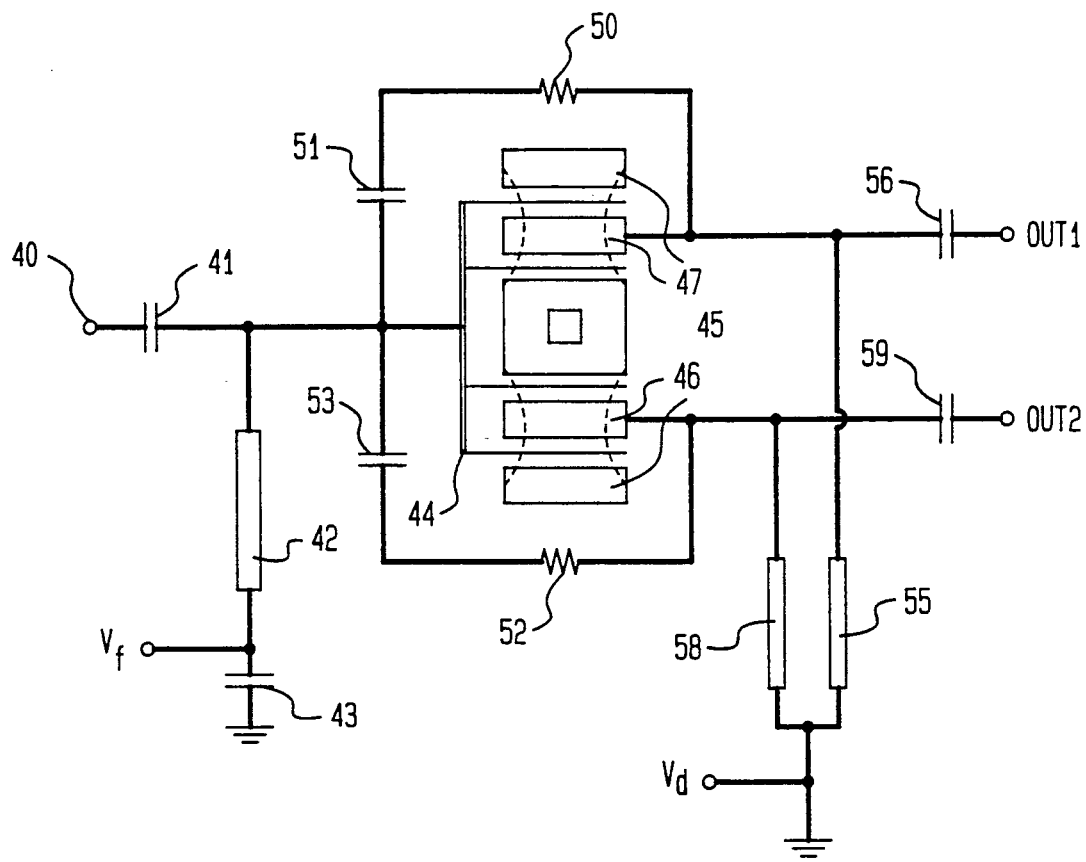
FIG. 4 is a schematic diagram of a feedback FET splitter employed in this invention.

Referring to FIG. 4, there is shown a layout in integrated circuit form of a active feedback splitter which can be employed for module 30 of FIG. 3 and utilizes feedback associated with an FET. As one can see from FIG. 4, the input signal to the splitter is applied at terminal 40 via capacitor 41. The capacitor 41 is coupled to one terminal of a resistor 42 which resistor 42 is directed to ground via capacitor 43. The junction between capacitor 41 and resistor 42 is applied to the gate electrode 44 of the FET device. The gate electrode 44 is associated with a common source electrode 45 and drain electrodes 46 and 47. As seen, the FET has two output drain electrodes 46 and 47 where each drain electrode is fed back to the gate electrode by means of a resistor and capacitor. Hence, drain electrode 47 is fed back to the input gate electrode 44 by means of resistor 50 and capacitor 51. In a similar manner drain electrode 46 is fed back to the gate electrode by means of resistor 52 and capacitor 53. The drain electrode 41 serves as one output for the splitter device and is coupled to the point of reference potential via a resistor 55. One terminal of resistor 55 is coupled to a capacitor 56 which provides one output (OUT 1). The other drain electrode 46 is coupled to the point of reference potential via a resistor 58 which has one terminal coupled to an output capacitor 59 for the second output (OUT 2). Hence, it is seen that the circuit of FIG. 4 operates to supply all the functions of the active power splitter or signal splitter 30 of FIG. 3.

Figure 5:
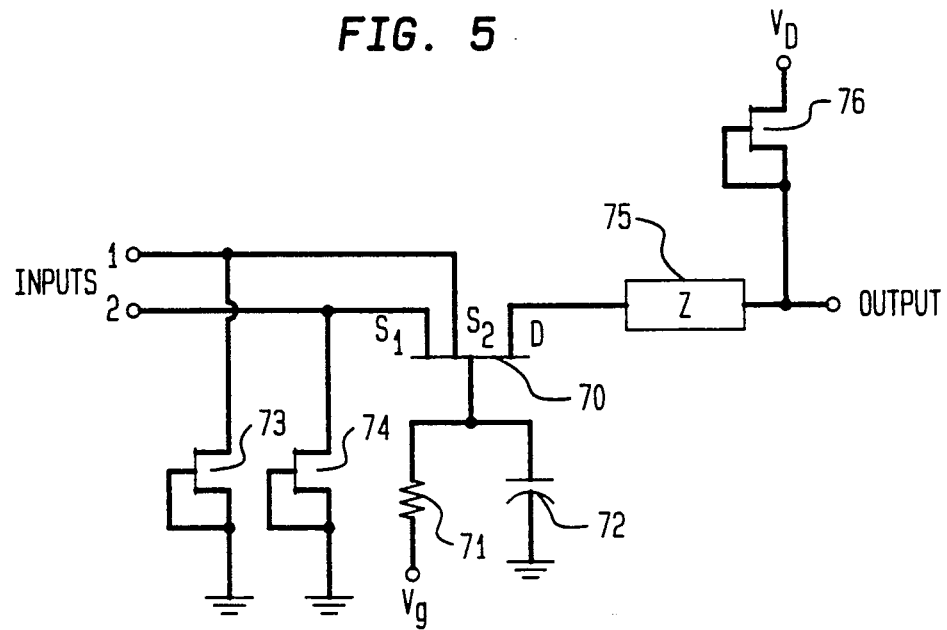
FIG. 5 is a schematic diagram of a common gate combiner with active loads.

Referring to FIG. 5, there is shown a schematic diagram of a combiner such as combiner 16 which can be employed in the circuit shown in FIG. In FIG. 5, the circuit configuration as will be described employs common gate FETS each of which employs an active load. As shown in FIG. 5, the two inputs designated as 1 and 2 are applied to the dual source electrodes of an FET 70. The FET 70 has its gate electrode biased by means of a resistor 71 and a bypass capacitor 72. The resistor 71 is coupled to a gate bias source Vg. The input source electrodes (51, 52) are each shunted to a point of reference potential by FETS 73 and 74. Both FETS 73 and 74 have the source electrodes connected to the gate electrodes to operate as a diode configuration and both FETS have the connected source and gate electrodes connected to a point of reference potential. The drain electrode of FET 73 is coupled to input number 1 with the drain electrode of FET 74 coupled to input number 2. The drain electrode of FET 70 is directed to the input of a suitable matching network 75. The output of the matching network 75 is coupled to another FET 76 having the source connected to the gate electrode and having the drain electrode coupled to a point of operating potential designated as VD. The output of the matching network as connected to the source and gate electrode of FET 76 is taken as the output of the active combiner. As one can understand, the matching network 75 is a well known circuit and is utilized for impedance matching as well as to apply bias to the drain electrode of FET 70.

The above-described common gate FET combiner is relatively smaller than a distributed circuit and provides a more nearly resistive load for the mixer IF output ports (5, 6) which again serves to improve IP3 performance. The combiner may require a low pass filter at the outputs to achieve a desired LO leakage rejection. In either case, an IF amplifier will still be required at the output to achieve an output power +18 dBm. The IF amplifier (not shown) is coupled to the output of the combiner and has a 6 dB gain in the IF range of 1-2.5 GHZ by way of example.

Figure 6:
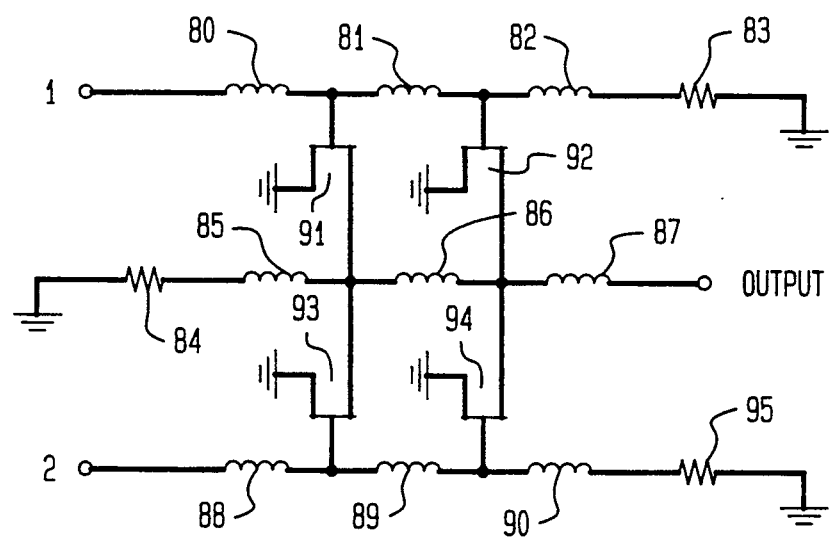
FIG. 6 is a schematic diagram of an IF combiner utilizing a distributed circuit technique.

Referring to FIG. 6, there is shown a schematic diagram of a distributed combiner which again may be utilized for combiner 16 of FIG. 1. As one can see from FIG. 6, the distributor combiner has the first input port designated as 1. Input port 1 is connected to the series connections of inductor 80 in series with inductor 81 in series with inductor 82 in series with resistor 83. One terminal of resistor 83 is coupled to a point of reference potential. The junction between inductors 80 and 81 is coupled to the gate electrode of a first FET 91. The FET 91 has the source electrode directed to a point of reference potential. The junction between inductors 81 and 82 is coupled to the gate electrode of a second FET 92 also having its source electrode coupled to a point of reference potential.

The drain electrode of FET 91 is coupled between the junction of inductors 85 and 86 while the drain electrode of FET 92 is coupled between the junction of inductors 86 and 87. The other terminal of inductor 87 is designated as the output. As seen, the drain electrodes of transistors 91 and 92 are coupled to the drain electrodes of FETS 93 and 94. FETS 93 and 94 are associated with the second input port of the combiner. Thus, in a similar manner, port number 2 is coupled to an input terminal of a first inductor 88 which is in series with inductor 89 which is in series with inductor 90. Inductor 90 is in series with resistor 95 wherein one terminal of resistor 95 is coupled to a point of reference potential.

Thus as indicated above for port number 1, the gate electrode of FET 93 is connected to the junction of inductors 88 and 89 and the gate electrode of FET 94 is coupled to the junction of inductors 89 and 90. The drain electrode of FET 93 is again coupled to the junction between inductors 85 and 86 and the drain electrode of FET 94 is coupled to the junction between inductors 86 and 87. It is, of course, seen that the drain electrodes of FETS 91 and 93 are connected together as are the drain electrodes of FETS 92 and 94.

The active distributed combiner as shown in FIG. 7 is more process tolerant and because of its transmission line simulation, the combiner can be designed to also perform like a low pass filter. This provides high rejection of any LO leakage appearing at the IF ports. As indicated above, the common gate FET combiner of FIG. 6 is smaller than the distributed circuit of FIG. 7 and provides a more nearly resistive load to the mixer IF ports which would again improve IP3 performance. Thus as one can ascertain from the above, there is described a complete double balanced mixer configuration as shown in FIG. 1 with the various components for the mixer configuration shown in the other Figures. It would, of course, be understood that the mixer as described herein utilizes a lumped element balun for baluns 11 and 15 as shown in FIG. 1. The lumped element balun employs a feedback FET circuit to split the input in two all-pass networks to provide controlled phase shifts. This approach provides better differential phase performance than that employed for distributed balun circuits of the prior art.

The phase control of the all-pass networks is sensitive to capacitive values which are process sensitive. Thus better differential phase performance will yield a better IP3 performance. The lumped element approach is not lossy as a distributed design and therefore eliminates the need for an amplifier at the RF input.

Thus there is described a monolithic double balanced mixer with a high third order intercept point (IP3) employing lumped element baluns. Typically, the above-noted mixer can operate in the X-band employing the balanced FET mixer as shown in FIG. 2. Typical frequencies are RF and LO from 8.5 to 10.5 GHZ to produce an IF from 0.5 to 2 GHZ. The gain is approximately 8 dB from RF to IF with an IP3 of better than +30 dBm.

The above circuits were utilized and completely incorporated on integrated circuit chips using MMIC techniques and employing MESFETS as the active mixer devices. It is, of course, understood that MOSFETS can be utilized as well and fabricated in GaAs technology using MMIC techniques.

We claim:

1. A double balanced mixer apparatus for mixing an RF input signal with a local oscillator (LO) signal to provide at an output an intermediate frequency (IF) signal with a high third order intercept point, comprising:
- a first active distributed input balun means having an input port for receiving said local oscillator signal (LO) and having first and second output ports,
- a double balanced resistive FET quad mixing means having first and second input ports for receiving said local oscillator signal, with said first input port coupled to said first output port of said first input balun, and said second input port coupled to said second output port of said first input balun, said mixing means having a third and a fourth input port for receiving said RF signal, and a first and second output port for providing an IF signal,
- a second active distributed input balun means having an input port for receiving said RF signal and having first and second output ports, with the first output port coupled to said third input port of said mixing means and said second output port coupled to said fourth input port of said mixing means,
- a combiner means having a first input port coupled to said first output port of said mixing means and a second input port coupled to said second output port of said mixing means to provide at an output of said combiner, said intermediate frequency signal (IF) relatively free of said LO and RF frequencies and having a high third order intercept point, 'wherein said combiner means is a common gate combiner comprising:
- a first FET having dual source electrodes, a gate and a drain electrode with said first source electrode serving as said first input port, and with said second source electrode serving as said second input port, with said first source electrode directed to a point of reference potential via a second FET having the source electrode connected to the gate electrode and the drain electrode connected to said first source electrode of said first FET, and with said second source electrode directed to said point of reference potential via a third FET having the source electrode connected to the gate electrode and the drain electrode connected to said second source electrode of said first FET, with the gate electrode of said first FET adapted to receive a bias voltage and with the drain electrode of said first FET serving as said output port, with said drain electrode of said first FET coupled to a source of operating potential via a fourth FET having the source electrode connected to the gate electrode and connected to the drain electrode of said first FET and with the drain electrode of said fourth FET adapted to receive a source of operating potential.

2. The double balanced mixer according to claim 1, further including first and second amplifiers each having an input and an output, with the input of said first amplifier coupled to said first output port of said first balun, and with the output of said first amplifier coupled to the first input port of said mixing means, with the input of said second amplifier coupled to said second output port of said first balun and with the output of said second amplifier coupled to the second input port of said mixing means.

3. The double balanced mixer apparatus according to claim 1, wherein said double balanced resistive FET quad mixing means comprises four FETS each having a gate, drain and a source electrode, with the drain electrodes of said first and second FETS (20, 21) connected together to form said third input port (3) with the drain electrodes of said third and fourth FETS (22, 23) connected together to form said fourth input port (4) with said third and fourth input ports for receiving said RF signal, with the source electrodes of said first and fourth FETS (20, 23) connected together to form said first output port (5) and with the source electrodes of said second and third FETS (21, 22) connected together to form said second output port (6) with the gate electrodes of said first and third FETS (20, 22) connected together to form said first input port (1) and with the gate electrodes of said second and fourth FETS (21, 23) connected together to form said second input port (2) with said first and second input ports (1,2) for receiving said LO signal.

4. The double balanced mixer according to claim 3 wherein said FETS are MESFETS.

5. The double balanced mixer according to claim 3, wherein said FETS are MOSFETS.

6. The double balanced mixer according to claim 4, wherein said MESFETS are GaAs devices.

7. The balanced mixer according to claim 1, wherein said FETS are MESFETS.

8. The balanced mixer according to claim 1, wherein said FETS are MOSFETS.

* * * * *